United States Patent [19]

Boutigny

[11] Patent Number: 4,935,793
[45] Date of Patent: Jun. 19, 1990

[54] TRANSFER DEVICE HAVING SELF-INDUCTION MEMBERS

[75] Inventor: Pierre-Henri Boutigny, Epinay Sous Senart, France

[73] Assignee: U.S. Philips Corp., New York, N.Y.

[21] Appl. No.: 303,964

[22] Filed: Jan. 27, 1989

Related U.S. Application Data

[63] Continuation of Ser. No. 860,267, May 6, 1986, abandoned.

[30] Foreign Application Priority Data

May 14, 1985 [FR] France ................. 85 07283

[51] Int. Cl.$^5$ ............... H01L 29/78; H01L 27/22; H01L 27/02
[52] U.S. Cl. .......................... 357/24; 357/27; 357/51; 377/57; 377/58; 377/60; 377/61; 377/62
[58] Field of Search ........... 357/24, 51, 24 M, 24 LR, 357/27; 377/57, 58, 60, 61, 62; 336/200, 232

[56] References Cited

U.S. PATENT DOCUMENTS

| 3,921,195 | 11/1975 | Smith et al. | 357/24 |
| 4,310,821 | 1/1982 | Frances | 336/232 |
| 4,369,557 | 1/1983 | Vandebult | 336/200 |

OTHER PUBLICATIONS

Aichelmann, Jr., "Charge-Coupled Device Clocking Technique", IBM Technical Disclosure Bulletin, vol. 20, No. 11A, Apr. 1978.

Primary Examiner—Andrew J. James
Assistant Examiner—Ngan Van Ngo
Attorney, Agent, or Firm—Steven R. Biren

[57] ABSTRACT

The invention relates to a charge transfer device (CTD) having two or four phases, for which the speed of transferring the stored charges is increased by means of self-induction members connected to each of the clock areas of each memory element so that the capacitive impedance presented initially to the clock signal generator by the CTD becomes a substantially resistive impedance. Such a charge transfer device having an increased transfer speed is used in digital oscilloscopy or in systems for handling pictures.

6 Claims, 5 Drawing Sheets

TRANSFER DEVICE HAVING SELF-INDUCTION MEMBERS

This is a continuation application of Ser. No. 860,267, filed May 6, 1986, now abandoned.

BACKGROUND OF THE INVENTION

The invention relates to charge transfer devices comprising n memory elements, in which the stored charges are transferred by means of two or four clock signals produced by a clock signal generator, the two or four clock signals being applied to each memory element by means of two or four contact areas, at each of which appears a capacitance Ce between adjacent areas and a capacitance Cs between an area and the substrate of the charge transfer device.

The invention further relates to applications of such charge transfer devices, for example for handling digital oscilloscopy signals or for handling pictures. For example, a prior-art CCD system for rapid data recording is shown in U.S. Pat. No. 4,393,357.

A charge transfer device (CTD) is a shift register for analog signals. In its simplest form it is constituted by a monocrystalline semiconductor substrate, on which different electrodes are arranged, which are isolated from the substrate by oxide layers. The substrate generally consists of silicon and the isolating material is silicon oxide. Under each electrode appear charge packets, which are injected by means of an electric contact under the control of a clock signal. The charge transfer device stores the samples of the signal in the form of charge packets and then transfers them generally to a charge amplifier, while holding the charge packets isolated from each other. According to the technologies used, the transfers are effected by means of two, three or four consecutive electrodes for each memory element. Clock signals are applied to these electrodes, the voltage of these signals varying periodically and these signals having two, three or four phases according to the number of electrodes. Thus, potential wells are formed under each electrode, which are translated progressively over the whole line of memory elements producing the machanism of charge transfer from one electrode to the following electrode.

However, a high charge storage capacity has to be ensured and the effects of the surface states have to be reduced. Therefore, the major part of the charge is transferred in a highly doped zone close to the surface under the influence of the self-induced electric field and the remaining part of the charges is transferred in a deeper zone of the crystal having a lower doping under the influence of an external electric field. A peristaltic charge transfer device (PCCD) is then concerned, which may further have an improved transfer efficiency by providing a profiled doping in order to reduce the influence of the surface states. A profiled peristaltic charge transfer device ($P^2CCD$) is then obtained. These devices have a transfer efficiency reaching 0.999999 and a maximum clock frequency of 1.5 GHz.

The circuits for generating the four clock signals of a $P^2CCD$ having four phases therefore have to supply signals having very rapid transitions between the voltage levels, i.e. for the capacitive charges which are important.

These capacitive charges have such values that at frequencies higher than, for example, 100 MHz, great difficulties are involved in obtaining the clock pulse generator, as a result of which the charge transfer devices cannot be used in the proximity of their maximum natural operating frequency.

Such a charge transfer device has been described in the article entitled: "$P^2CCD$ in 60 MHz oscilloscope with Digital Image Storage" of H. Dollekamp, L. Esser, H. de Jong, Philips Tech. Rev. (1982), Vol. 40, No. 170, p. 55 to 68. An oscilloscope is described therein which utilizes a charge transfer device in which the sampling and memorization of the imput signal and then the transfer of the required samples to an output member are carried out. This article illustrates that in the case of a charge transfer device of the $P^2CCD$ type provided with four clock electrodes, the operation of transferring charges can generally not exceed operating frequencies higher than 180 MHz, while the CTD could intrinsically operate at 1.5 GHz - because the circuits for generating the clock signals cannot operate at higher frequencies, taking into account the high capacitive impedances presented by the transport zone of the CTD. This limit of 180 MHz can be slightly improved, but at the expense of a substantial increase of the dissipation of the circuits for generating the clock signals, which is detrimental to the applications themselves.

On the contrary, the generation of fast clock signals for load impedances which are highly resistive does not give rise to great difficulties in the frequency range aimed at.

SUMMARY OF THE INVENTION

Consequently, the invention has for for its object to determine a structure of charge transfer devices, for which the load impedances presented by the clock connections of the CTD to the clock signal generator are highly resistive.

Therefore, the invention as defined above is characterized in that each of the two or four contact areas of a memory element has connected to it one of the ends of two self-induction members LA and LB in such a manner that, the other end of the self-induction member LB being loaded by an impedance Zc of the resistive kind, the impedance presented by the other end of the self-induction member LA is also of the resistive kind.

It is further characterized in that the contact areas controlled by the same clock signal are mutually rearranged in a chain of transport groups, the other end of the self-induction member LB connected to a surface being connected to the other end of the self-induction member LA of the following area, the last other end of the last self-induction member LB of each transport group being connected to a resistive load impedance Zc.

A charge transfer device will present at the clock connections parasitic capacitances of different origin. A charge transfer device having, for example, four clock signals h1, h2, h3, h4 occurring at four consecutive electrodes p1, p2, p3 and p4, respectively, will present for a given memory element interconnection capacitances between the electrodes p1 and p2, between the electrodes p2 and p3, between the electrodes p3 and p4 and between the electrodes p4 and p'1, where p'1 receives the same clock signal as the electrode p1, but belongs to the following memory element. In the same manner, each electrode p1, p2, p3 or p4 will present with respect to ground and for a single memory element four capacitances Cs.

For a given memory element, eight capacitance sources connected to each other are obtained. When all the memory elements are connected in series in order to form, for example, as CTD having 256 memory elements, the overall capacitance becomes high and in certain cases prohibitive, taking into account the considered operating frequencies. Thus, the overall capacitance which can be obtained at each clock connection may be about 25 pF.

In order to reduce this overall capacitance, the invention provides the interconnection of the memory elements connected to the same clock electrode in that with each contact surface are associated self-induction members which compensate for the capacitive charge in order that the impedance at the input of the charge transfer device is a highly resistive impedance. This resistive impedance is the characteristic impedance of the quadrupole composed of the capacitive impedance of the surface and of the self-induction members.

All the N consecutive memory elements are thus connected to each other and the last element is connected to the resistive load Zc by the self-induction members. It is desirable to combine two adjacent self-induction members LA and LB to form a single self-induction member. The charge transfer device having 4 phases and N memory elements, there will consequently be 4(N+1) self-induction members. It is possible to connect the N memory elements each having eight self-induction members according to a suitable rearrangement facilitating the organization of the circuit and the realization of the masks for obtaining the final integrated circuit. Thus, the N memory elements are organized in j transport groups which each comprises k memory elements with $1 \leq j \leq N$ and $N \geq k \geq 1$.

What has been indicated for a charge transfer device having 4 phases applies to a charge transfer device having 2 phases the symmetry of the clock signals being analogous.

According to a preferred embodiment, the self-induction members are constituted by a self-inductance coil obtained by means of a configuration of a conductive layer having a self-inductance, for example a helix. The conductive spiralized layer is preferably of the same kind as the conductor forming the interconnections between the clock electrodes and the clock electrodes themselves. Thus, the spiralized conductors, the clock electrodes and the interconnections between the clock electrodes can be obtained by means of the same mask.

However, it is also possible to form the conductive layer on an isolating support, to fix the monolithic integrated circuit thereto and to establish the interconnections of the self-induction members with the monolithic integrated circuit with the aid of thermocompression or other means.

BRIEF DESCRIPTION OF THE DRAWING

In order that the invention may be readily carried out, it will now be described more fully, by way of example, with reference to the accompanying drawings, in which.

DESCRIPTION OF THE PREFERRED EMBODIMENTS

Figure 1:
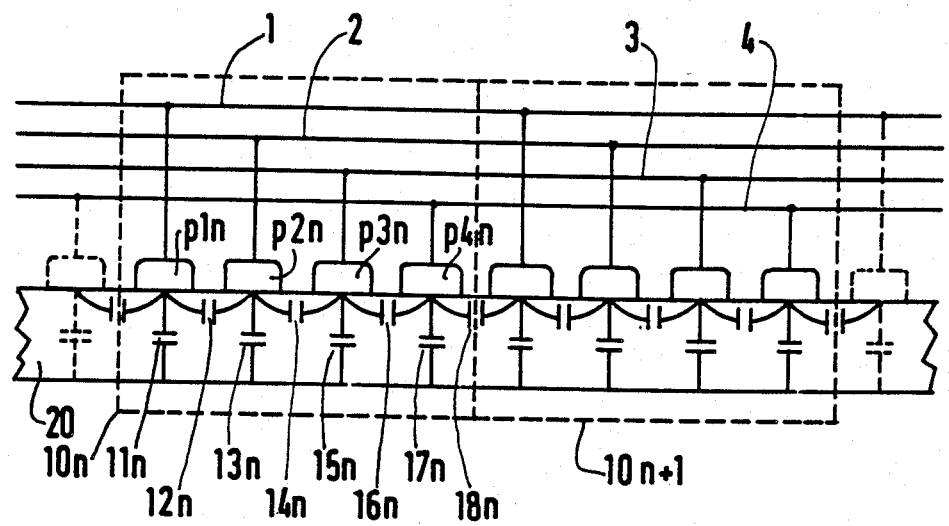
FIG. 1 shows diagrammatically two memory elements of a charge transfer device (CTD) having four phases, in which the parasitic capacitances are illustrated.

FIG. 1 shows diagrammatically two consecutive memory elements $10_n$, $10_{n+1}$ of a charge transfer device (CTD) having four clock signals h1, h2, h3, h4 present at the connections 1, 2, 3 and 4, respectively. The memory element $10_n$ of the row n has electrodes $p1_n$, $p2_n$, $p3_n$, $p4_n$ connected to the connections 1, 2, 3 and 4, respectively. These electrodes are deposited on the surface of a substrate 20, in which the different regions required for obtaining a charge transfer device (CTD) according to the prior art are formed.

Different parasitic capacitances appear in such a CTD. These are capacitances $12_n$ between the electrodes $p1_n$ and $p2_n$, $14_n$ between the electrodes $p2_n$ and $p3_n$, $16_n$ between the electrodes $p3_n$ and $p4_n$ and $18_n$ between the electrodes $p4_n$ and $p1_{n+1}$. These capacitances $12_n$, $14_n$, $16_n$, $18_n$ have substantially equal values and are designated by Ce in the following part of the description. Between each electrode and the substrate, capacitances $11_n$, $13_n$, $15_n$, $17_n$ appear, again having substantially equal values for each electrode, designated by Cs in the following part of the description.

Figure 2:
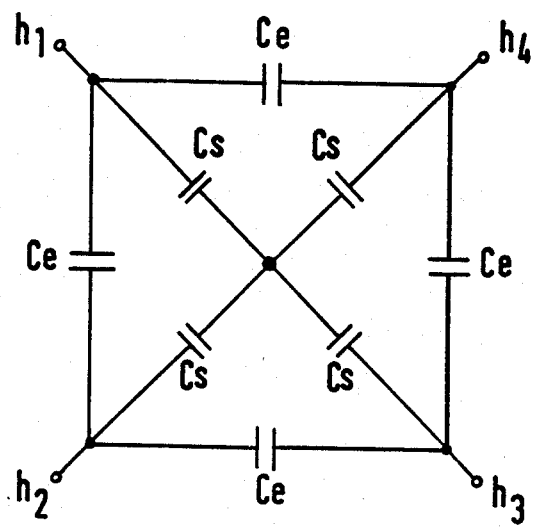
FIG. 2 shows an electric equivalent circuit diagram of the interconnection of these parasitic capacitances for an elementary cell.
Figure 3:
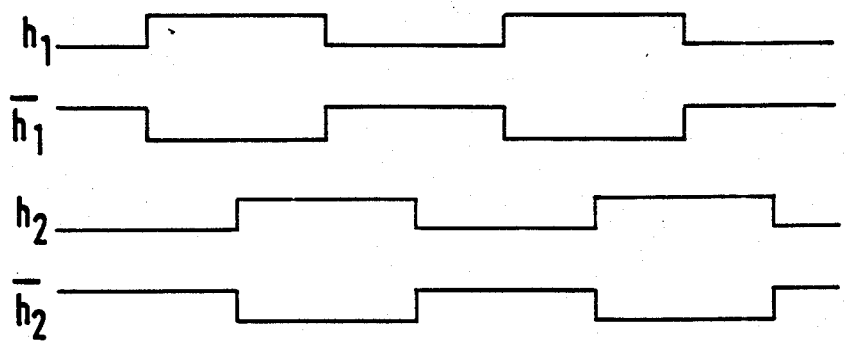
FIG. 3 shows a diagram of the times for the application of the clock signals.

FIG. 2 shows an electric equivalent circuit diagram of the interconnection of the capacitances Ce and Cs to each other for a memory element of the CTD. This circuit diagram indicates the complete symmetry which exists in the interconnection of the different capacitances. In the conventional mode of operation of a CTD, the particularity exists that the clock signal h3 is inverse to the clock signal h1 and that likewise the clock signal h4 is inverse to the clock signal h2. Consequently, it follows that: $h_3 = \overline{h1}$ and $h4 = \overline{h2}$. The two clock signals h1 and h2 are shifted in time; the time diagram is shown in FIG. 3. In the dynamic range, the equivalent circuit diagram of FIG. 2 therefore presents a supplementary symmetry with clock signals in phase opposition on each of the diagonal lines shown.

A generator of clock signals h1, h2, $\overline{h1}$, $\overline{h2}$ connected in the manner shown in FIG. 2 would be loaded by the capacitive impedance constituted by the k series-connected memory elements. In order to suppress this capacitive impedance observed by the clock signal generator, according to the invention, the memory elements are connected to each other by means of self-induction members, for example, self-inductance coils.

Figure 4:
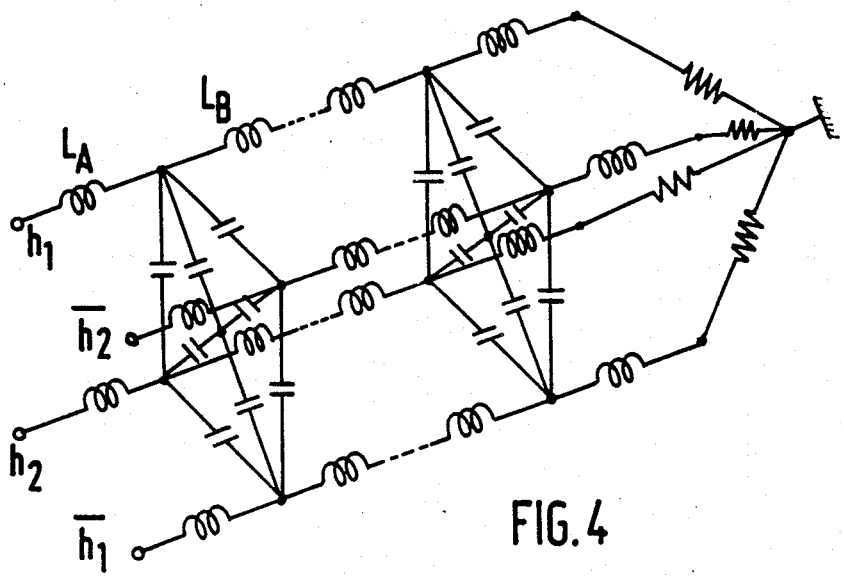
FIG. 4 shows an electric equivalent circuit diagram representing according to the invention the interconnection of the electric equivalent circuit diagrams shown in FIG. 2 for a sequence of elementary cells by means of connection inductances.

FIG. 4 shows the electric equivalent circuit diagram of the CTD thus obtained. Each top of the square of the preceding electric equivalent circuit diagram, from which the clock signals are conveyed, is connected to the following analogous top by means of self-inductance coils. The output of the last memory element is connected through the output self-inductance coils having four resistors equal to the characteristic impedance Zc of the network. In order to obtain the desired characteristic impedance Zc, the inductance is defined in the following manner:

With a charge transfer device having N memory elements, it is possible to rearrange these N memory elements in j transport groups with $1 \leq j \leq N$ each comprising k memory elements, such as $1 \leq k \leq N$.

Each transport group will thus present global capacitances Cej and Csj, such as:

$$Cej = Ce \times k \text{ and } Csj = cs \times k.$$

For a characteristic impedance Zc chosen for a transport group, the value of the inductance necessary for obtaining the connections described by means of the rearranged self-induction members LA and LB, is such that the sum of the values of the self-inductances LA and LB is equal to:

$$L = 2 \cdot Zc^2 \cdot k \left( Ce + \frac{Cs}{2} \right).$$

Preferably, the value of each self-induction member LA or LB is equal to L/2.

The value BW of the pass band of the transport group is then determined by:

$$BW = \frac{1}{2\pi Zc(Cej + Csj/2)}.$$

Figure 5:
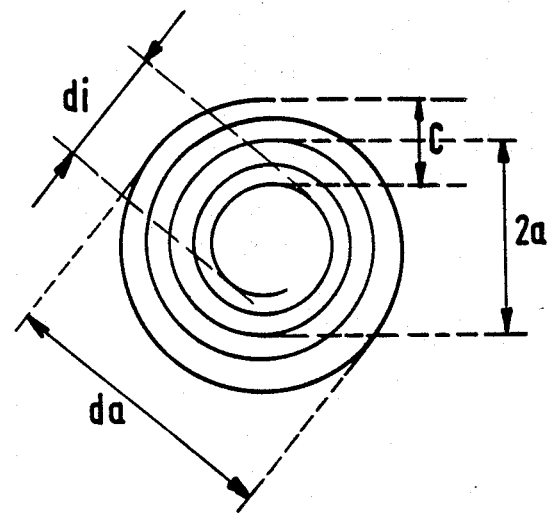
FIG. 5 shows an example of a self-induction member constituted by a spiralized inductance.
Figure 5:
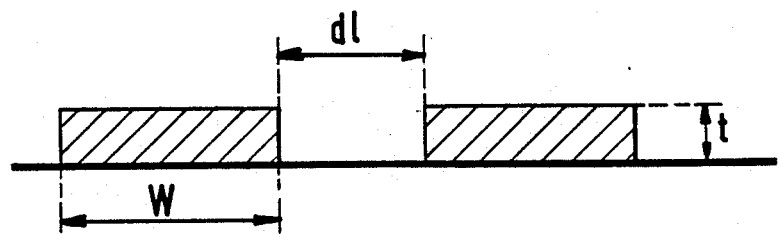

FIG. 5 shows an example of a self-induction member constituted by spiralized inductance. It is constituted by a metal ribbon having a width W and a thickness t, the distance between the turns being dl. The complete helix will present an internal distance di and an external distance da. The mean diameter of the helix is 2a; the thickness of the helix is $$c = \frac{da - di}{2}.$$

The helix is formed by m revolutions, each revolution corresponding to an angular displacement of 2. The value of the inductance is then equal to:

$$L(nH) = \frac{m^2 a^2}{25(8a + 11c)}.$$

with a and c expressed in microns.

An inductance having an external distance da=450 μm has a value of 8 nH with the following parameters: a=150 μm; c=150 μm; m=5; dl=5 μm; w=20 μm, t=5 μm.

For a charge transfer device having 256 memory elements and having an overall capacitance $Ce_N = N \times Ce = 10$ pF and $Cs_N \times Cs6$ pF, organized in 8 transport groups formed by 32 memory elements, the capacitances defined already for each transport group are $Ce_{j=}1.25$ pF and $Cs_{j=}0.75$ pF. With an inductance of L=8 nH associated with each contact surface, the width of the pass-band is equal to 1.9 GHz.

Figure 6:
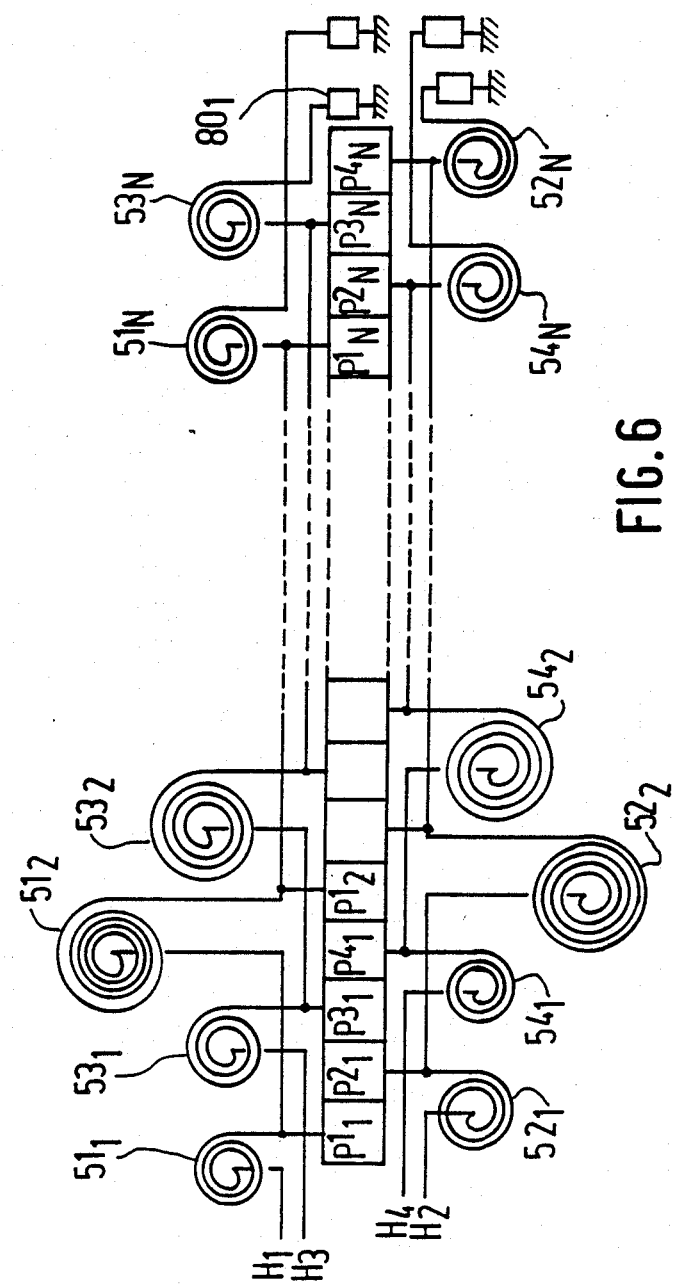
FIG. 6 shows an example of the interconnection of the self-induction members with each contact surface.

FIG. 6 shows the interconnection of the self-induction members with each contact surface. Now the case of the clock signal $H_1$ is considered, a similar situation applying to the cases of the clock signals $H_2$, $H_3$ and $H_4$.

The clock signal $H_1$ emitted by the clock signal generator is connected to one end of the self-induction member $51_1$, whose other end is connected to the contact surface $pl_1$ of the first memory element. This contact surface $pl_1$ is also connected to one end of the self-induction member $51_2$, whose other end is connected to the contact surface $pl_2$, and so on; in the case in which the charge transfer device is realized with N memory elements, the $N^{th}$ contact surface $pl_N$ is connected to the two self-induction members $51_{N-1}$ and $51_N$. The other end of this last element is connected to ground through a load resistor $80_1$ equal to the characteristic impedance Zc.

The self-induction members $51_2$–$51_{N-1}$ all have substantially the same value equal to $$L = 2 \cdot Zc^2 \cdot \left( Ce + \frac{Cs}{2} \right)$$

corresponding to the sum of the values of LA and of LB. The location of LA and LB are shown in FIG. 4.

The self-induction members $51_1$ and $51_N$, LA and LB, respectively, have a value substantially equal to $$\frac{L}{2}.$$

In an analogous manner, the clock line $H_3$ presents the self-induction members $53_1$ to $53_N$; the clock line $H_2$ presents the self-induction members $52_1$ to $52_N$ and the clock line $H_4$ presents the self-induction members $54_1$ to $54_N$.

It is a matter of course that the value given to L corresponds to the case of the correct adaptation of the impedance and that a slightly different value will slightly modify the characteristics of the quadrupole, which results in a small reduction of performances of the charge transfer device, without departing from the scope of the invention.

Figure 7:
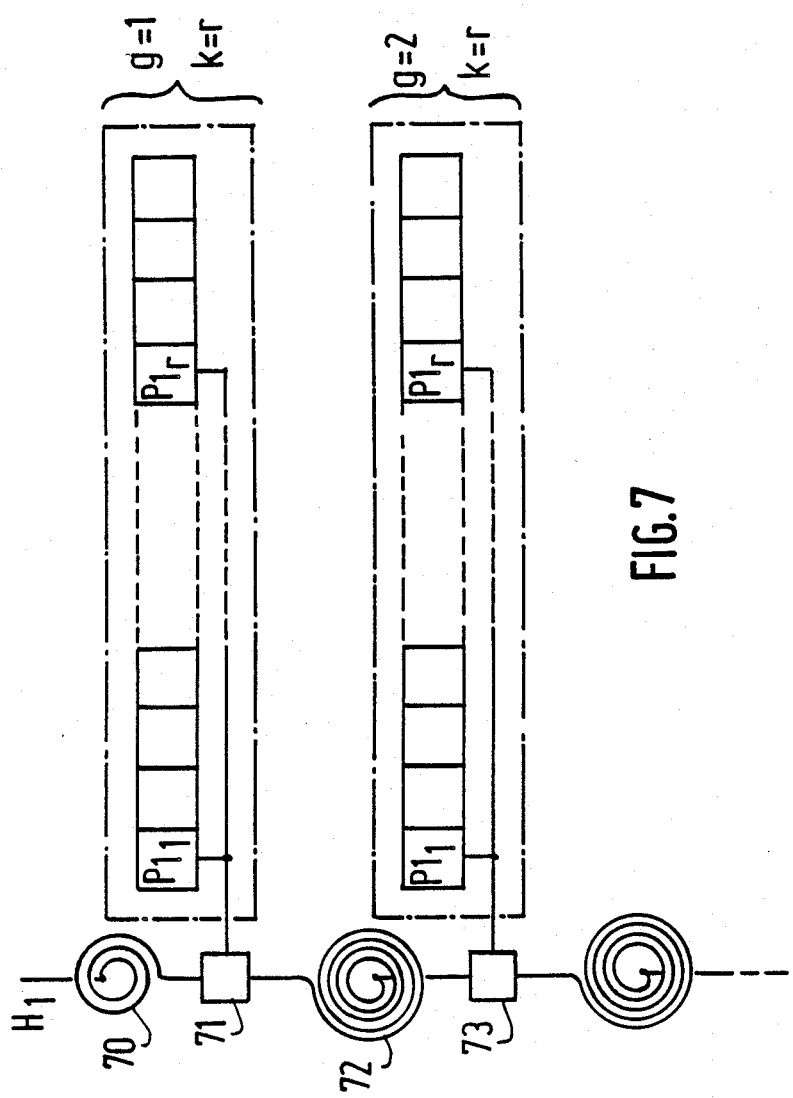
FIG. 7 shows an example of the interconnection of the self-induction members, in which r memory elements are rearranged in j transport groups.

In the case of FIG. 6, the CTD is organized with j=N and k=1. In this case, each self-induction member is connected to two contact surfaces or to one surface for the ends. In order to reduce the number of self-induction members, it is possible to carry out a rearrangement of the connections, as shown in FIG. 7.

Two transport groups (g=1 and g=2) are shown with preferably k=r memory elements. As in the preceding Figure, the explanations relate to the clock line H1, but this also applies to the other clock lines. The assembly of the memory elements constituting the charge transfer device is consequently rearranged in j transport groups, each having K memory elements. The contact surfaces $pl_1$, $pl_2$..., $pl_r$ of the group g=1 are connected to each other and connected to a common surface 71. Likewise, the contact surfaces $pl_1$, $pl_2$... $pl_r$ of the group g=2 are connected to each other and are connected to a common surface 73. Thus, j common surfaces are available on the charge transfer device. All these common surfaces are then connected to each other by self-induction members in a manner analogous to the connections shown in FIG. 6. Thus, in FIG. 7, the clock line $H_1$ is connected to one end of the self-induction member 70, whose other end is connected to the common surface 71. The latter is in turn connected to one end of the self-induction member 72, whose other end is connected to the common surface 73, and so on. The connections are analogous for the clock lines $H_2$, $H_3$ and $H_4$. The self-induction member situated between two contact surfaces has an inductance value equal to $$L = 2 \cdot Zc^2 \cdot r \left( Ce + \frac{Cs}{2} \right).$$

The two self-induction members situated at the ends have a value L/2.

Advantageously, these inductances are obtained in the course of the same operation as the formation of the interconnection network. They can also be realized according to a thin-film of thick film technology on a support, on which the monolithic integrated circuit is formed. The interconnections are then established by thermocompression or other means. These inductances can be realized by those skilled in the art in a quite different form without departing from the scope of the invention.

This charge transfer device is mainly used in the system requiring an operation at high frequencies, such as arrangements for handling a signal, more particularly of digital oscilloscopy, or for handling pictures.

What is claimed is:

1. A charge transfer device comprising N memory elements and a substrate, in which stored charges are transferred by means of one of two and four clock signals produced by a clock signal generator, said clock signals being applied to each memory element by means of a corresponding number of contact areas, at each of which contact areas is inherently present a capacitance Ce between adjacent contact areas and a capacitance Cs between a contact area and the substrate of the charge transfer device, characterized in that, in order to increase the speed of transferring the stored charges, two self-induction members each having two ends are provided, each of the contact areas of a memory element has connected thereto one of the ends of each of said two self-induction members and in such a manner that, when the other end of one of the self-induction members is loaded by a resistive load impedance, the impedance presented by the other end of the other self-induction member is also resistive.

2. A charge transfer device as claimed in claim 1, characterized in that the N memory elements are organized in j transport groups each comprising k memory elements with $1 \leq j \leq N$ and $N \geq k \geq 1$ and $N = j\,k$.

3. A charge transfer device as claimed in claim 2, characterized in that the contact areas controlled by the same clock signal are mutually arranged in a chain of transport groups, the other end of said one self-induction member connected to an area being connected to the other end of the other self-induction member connected to the following area, the last other end of the one self-induction member of each transport group being connected to a resistive load impedance Zc.

4. A charge transfer device as claimed in claim 3, characterized in that for the same clock signal the resistive load impedance of one of the j transport groups is the characteristic impedance of the quadrupole constituted by the self-induction members having a value substantially equal to L/2 and the k capacitances having a value Ce and Cs, the value L/2 of the self-induction members being determined by $$L/2 = [Zc^2 \cdot ]k \left( Ce + \frac{Cs}{2} \right)$$

times the value of the resistive load impedance squared so that the sum of the inductance values of the two self-induction members is equal to L.

5. A charge transfer device as claimed in claims 2, 3 or 4 characterized in that the self-induction members comprise a conductive layer.

6. A charge transfer device as claimed in claim 5, characterized in that the self-induction members are formed on a support and are interconnected to form a monothic integrated circuit fixed to said support.

* * * * *